United States Patent [19]
Kubo

[11] Patent Number: 5,373,938
[45] Date of Patent: Dec. 20, 1994

[54] IC ACCOMMODATION APPARATUS HAVING RETAINING LATCHES

[75] Inventor: Masaaki Kubo, Tokyo, Japan

[73] Assignee: Yamaichi Electric Co., Ltd., Tokyo, Japan

[21] Appl. No.: 165,586

[22] Filed: Dec. 13, 1993

Related U.S. Application Data

[63] Continuation of Ser. No. 937,103, Aug. 31, 1992, abandoned.

[30] Foreign Application Priority Data

Aug. 30, 1991 [JP] Japan ................ 3-245168

[51] Int. Cl.5 ............................. B65D 73/02
[52] U.S. Cl. ..................... 206/328; 206/331
[58] Field of Search ........... 206/328, 329, 331, 334

[56] References Cited

U.S. PATENT DOCUMENTS

| | | | |
|---|---|---|---|
| 3,604,557 | 9/1971 | Cedrone | 206/329 |
| 4,379,505 | 4/1983 | Alemanni | 206/329 |
| 4,535,887 | 8/1985 | Egawa | 206/328 |
| 4,615,441 | 10/1986 | Nakamura | 206/329 |
| 4,681,221 | 7/1987 | Chickanosky et al. | 206/328 |
| 4,718,548 | 1/1988 | Estrada et al. | 206/328 X |
| 4,747,483 | 5/1988 | Grabbe | 206/329 |
| 4,765,471 | 8/1988 | Murphy | 206/329 |
| 4,767,984 | 8/1988 | Bakker | 206/329 X |
| 4,881,639 | 11/1989 | Matsuoka et al. | 206/328 |
| 4,991,714 | 2/1991 | Clatanoff | 206/328 X |
| 5,026,303 | 6/1991 | Matsuoka et al. | 206/331 X |
| 5,203,454 | 4/1993 | Strong | 206/328 |

*Primary Examiner*—Paul T. Sewell
*Assistant Examiner*—BethAnne C. Cicconi
*Attorney, Agent, or Firm*—Wenderoth, Lind & Ponack

[57] ABSTRACT

A latch arm for engaging with a corner portion of an IC is pivotably supported on a corner portion of a base member of an IC carrier or IC socket. A spring element extends from a rear end of the latch arm, and is bent to accumulate resilient force when the latch arm is pivoted upwardly to remove engagement. Thus, the latch arm is pivoted in the engaging direction by the accumulated resilient force, in order to maintain engagement with the IC.

15 Claims, 4 Drawing Sheets

IC ACCOMMODATION APPARATUS HAVING RETAINING LATCHES

This application is a continuation of now abandoned application Ser. No. 07/937,103, filed on Aug. 31, 1992, now abandoned.

BACKGROUND OF THE INVENTION

1. Field of the Invention

This invention relates to an IC carrier for carrying thereon an IC for transportation or to be received in an IC socket. From another aspect, the present invention relates to an IC socket to be used for connection to an IC, and particularly to an IC holding construction which is common both to the IC carrier and the IC socket.

2. Brief Description of the Prior Art

U.S. Pat. No. 4,881,639 owned by the present applicant discloses a one-piece type IC carrier comprising a base member and torsion bars each integrally formed on each corner of the base member, and latch arms integral with the torsion bars, respectively and adapted to engage with an edge portion of an IC placed on the base member.

In this one-piece type IC carrier, each latch arm is pivoted upwardly about its corresponding torsion bar to remove its engagement with the IC. At this time, a twisting energy is accumulated in the torsion bar, and the latch arm is pivoted downwardly by this twisting energy so as to be brought into engagement with a corresponding corner portion of the IC.

The above carrier is operated to open and close the latch arms while exerting a twisting force to the torsion bars, so that the latch arms are engaged with and disengaged from the IC. Since the twisting force is repeatedly exerted to the torsion bars every time the IC is inserted and removed, the twisting stress is concentrated on connecting portions at both ends of the torsion bars which are integrally connected to the base member. As a result, the connecting portions gradually become fragile and unable to fully carry out their functions. Moreover, since the torsion bars are required to extend across the corner portions of the base member which has only a limited space, it is difficult to obtain a sufficient length for each of the torsion bars. Therefore, the connecting portions of the torsion bars tend to be more fragile and have a tendency to break. In addition, when the torsion bars and the latch arms are integrally formed in the base member, complicated narrow spaces or gaps for defining both of them must be formed therearound, and therefore, molding is not easy.

As described above, in the IC carrier or IC socket of the type in which the above latch arms are elastically engaged with and disengaged from the IC, the latch arms are integrally formed on the base member such that the latch arms themselves are elastically shifted at the connecting portions, for example, at the above torsion bars, with respect to the base member.

On the other hand, if the latch arms are formed separately from the base member to form a two-piece construction, the latch arms are pivotably supported relative to the base member through shafts or pins respectively, and the latch arms, when pivoted to positions for engagement with the IC, are brought into engagement with the base member through male and female engagement means in order to hold the IC. Such an IC engagement means as just mentioned can obviate problems such as deterioration in elasticity and breakage of the latch arms, the problems being inherent in the one-piece construction. However, the engagement between the male portion and the female portion is not reliable, and they are easily disengaged due to wear of the male and female portions.

SUMMARY OF THE INVENTION

It is therefore an object of the present invention to provide an IC carrier or IC socket capable of effectively obviating the problems inherent in the conventional one-piece type and two-piece type IC carrier or IC socket.

A specific object of the present invention is to provide an IC carrier or IC socket, in which latch arms remain fully functional even after they are used repeatedly.

According to one aspect of the present invention, there is essentially provided, in order to achieve the above objects, an IC carrier comprising a base member for carrying thereon an IC, latch arms each pivotably supported on the base member for pivoting between a first position for engaging with an edge portion of the IC and a second position for removing the engagement, and lock tabs each formed on an upper end of each of the latch arms and adapted to engage with and disengage from the edge portion of the IC. The IC carrier further comprises spring elements, each projecting from a pivotal portion of each of the latch arms and functioning to accumulate resilient force when the latch arms are pivoted in a direction for removing the engagement, so as to urge the latch arms in a direction toward engagement.

According to another aspect of the present invention, there is also provided an IC socket, comprising a base member for carrying thereon an IC, latch arms pivotably supported on the base member for pivoting between first positions for engaging with edge portions of the IC and second positions for removing the engagement, and lock tabs respectively formed on upper ends of the latch arms and adapted to engage with and disengage from the edge portions of the IC. The IC carrier further comprises spring elements projecting from pivotal portions of the latch arms, respectively. The spring elements accumulate resilient force when the latch arms are pivoted in a direction for removing the engagement, so as to urge the latch arms in a direction toward engagement.

According to the present invention, when the latch arms are pivoted upwardly and the spring elements are bent, the arms are disengaged from the IC in order to allow the IC to be removed. On the other hand, resilient forces accumulated in the spring elements when the latch arms are pivoted in the direction away from engagement, and this resilient force causes the latch arms to be pivoted toward engagement with the IC.

As described above, according to the present invention, there can be obviated problems often experienced in the conventional one-piece type IC carrier or IC socket which is integral with the base member, including that the latch arms are subjected to resilient deterioration, breakage, and the like due to repeated use thereof. In addition, such problems often experienced in the two-piece type IC carrier in which the latch arms are pivotably supported on the base member, including that the latch arms are subjected to insufficient engagement, erroneous engagement, and the like due to wear of the engaging portions because of repeated use. Even if the IC is repeatedly inserted into and removed from the base member of the IC carrier or IC socket, the latch arms can still fully carry out their intended functions.

DETAILED DESCRIPTION OF THE EMBODIMENT

One preferred embodiment of the present invention will now be described in detail with reference to FIGS. 1 through 8 inclusive.

The numeral 1 denotes a base member which forms a carrier body made of synthetic resin. The base member 1 is of a generally square configuration and has an IC accommodation portion 2 formed in and opening at a generally central portion thereof. The IC accommodation portion 2 is of a generally square configuration and accommodates therein an IC 3 such that each side of the IC 3 is in parallel relation with each side of the IC accommodation portion 2.

Figure 1:
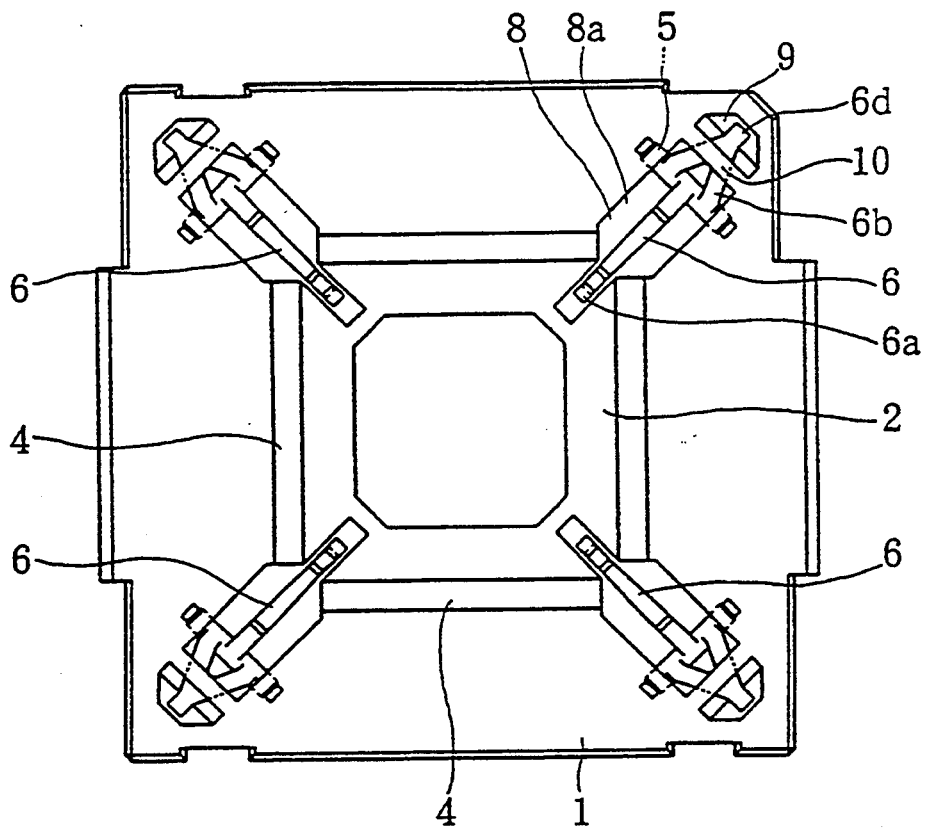
FIG. 1 is a plan view of an IC carrier showing one embodiment of the present invention.
Figure 2:
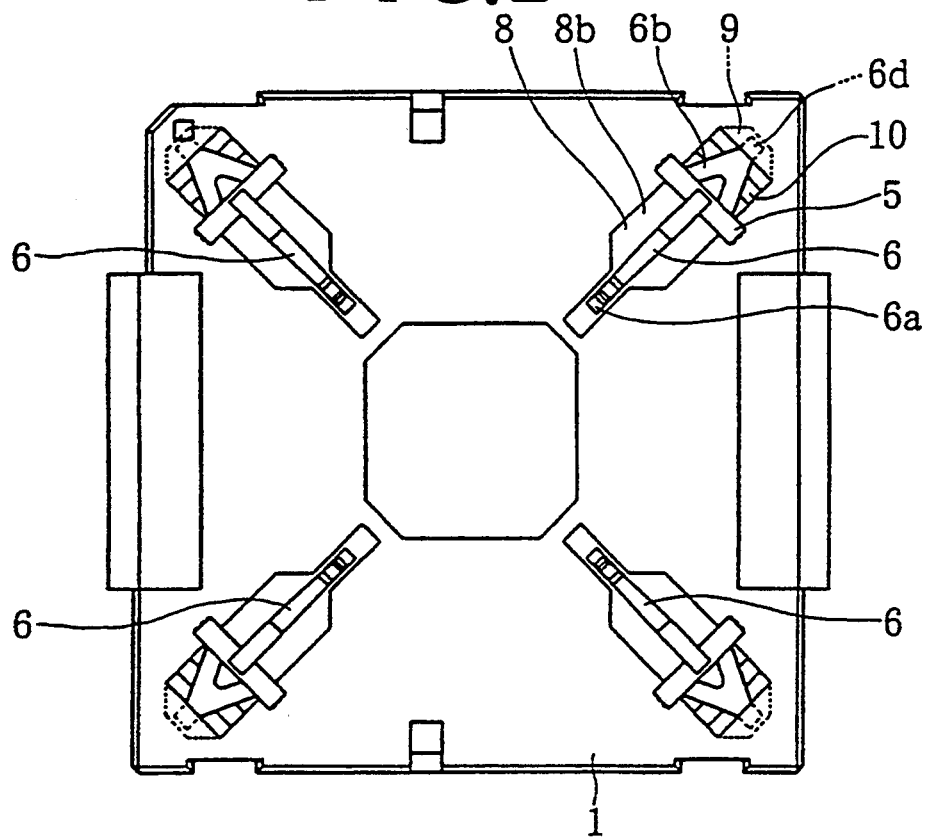
FIG. 2 is a bottom view of the IC carrier of FIG. 1.
Figure 3:
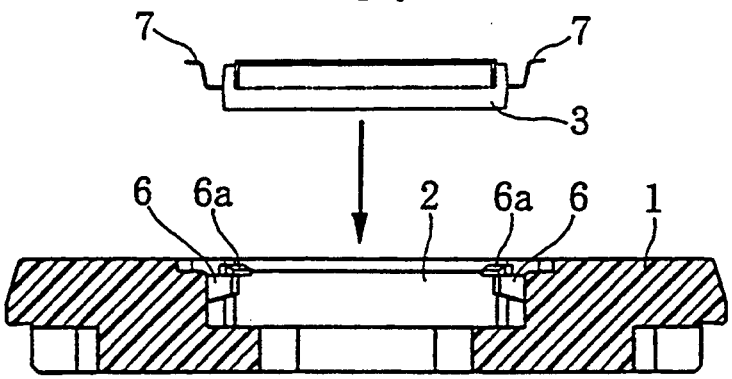
FIG. 3 is a sectional view of the IC carrier of FIG. 1.

As shown in FIG. 1, seat members 4, for respectively supporting rows of leads 7 arranged along and extending outwardly from each side of the IC 3, are formed on opposing sides (i.e. on either two opposing sides or on all four sides) of the IC accommodation portion 2. The IC accommodation portion 2 is defined inwardly of the seat members 4.

Each corner portion of the base member 1 is provided with a latch arm 6. Each latch arm 6 is received in a through-chamber 8 which opens through both upper and lower surfaces of each corner portion, and is pivotably supported on an inner surface of the through-chamber 8 through a shaft portion 5. Each latch arm 6 is disposed at an angle along a diagonal line of the IC accommodation portion 2, such that the axis of the shaft portion 5 is perpendicular to the diagonal line. Therefore, each latch arm 6 is pivoted upwardly and downwardly on the diagonal line about the shaft portion 5. When the latch arm 6 is pivoted downwardly, it is engaged with the corresponding corner portion of the IC 3 received in the IC accommodation portion 2, and when the latch arm 6 is pivoted upwardly, it is disengaged from the corresponding corner portion of the IC. Each latch arm 6 is provided at an inner end, i.e., upper end, with a lock tab 6a which is removably engaged with the IC 3.

Figure 5:
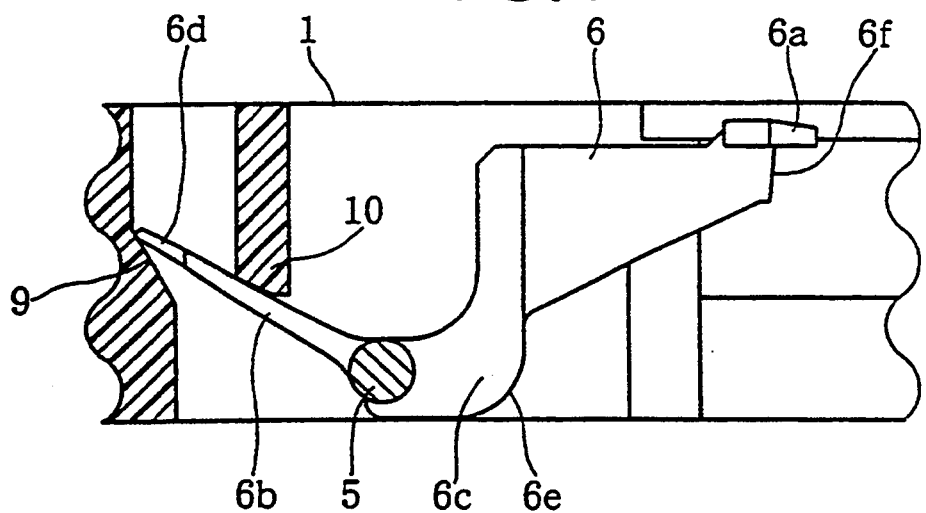
FIG. 5 is a sectional view of an important portion of the latch arm in a steady state.
Figure 8:
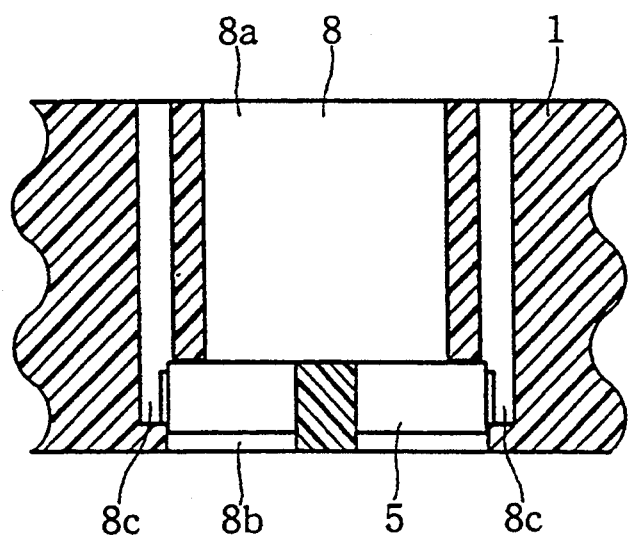
FIG. 8 is an enlarged sectional view of a pivotal shaft portion of the latch arm.

As shown in FIG. 8, the shaft portion 5 is pushed into a lower opening portion 8b of the through-chamber 8 so that both ends of the shaft are press-fitted into a bearing portion 8a formed in an inner side wall opposite the lower opening portion 8b. On the other hand, the latch arm 6, as shown in FIG. 5 for example, is raised from the shaft portion 5 disposed at a lower surface side of the base member 1 towards an upper opening portion 8a through an elbow portion 6c facing the lower opening portion 8b, and further extends inwardly on the diagonal line along the upper opening portion. A foremost or upper end of the latch arm 6 is provided with the lock tab 6a.

Figure 6:
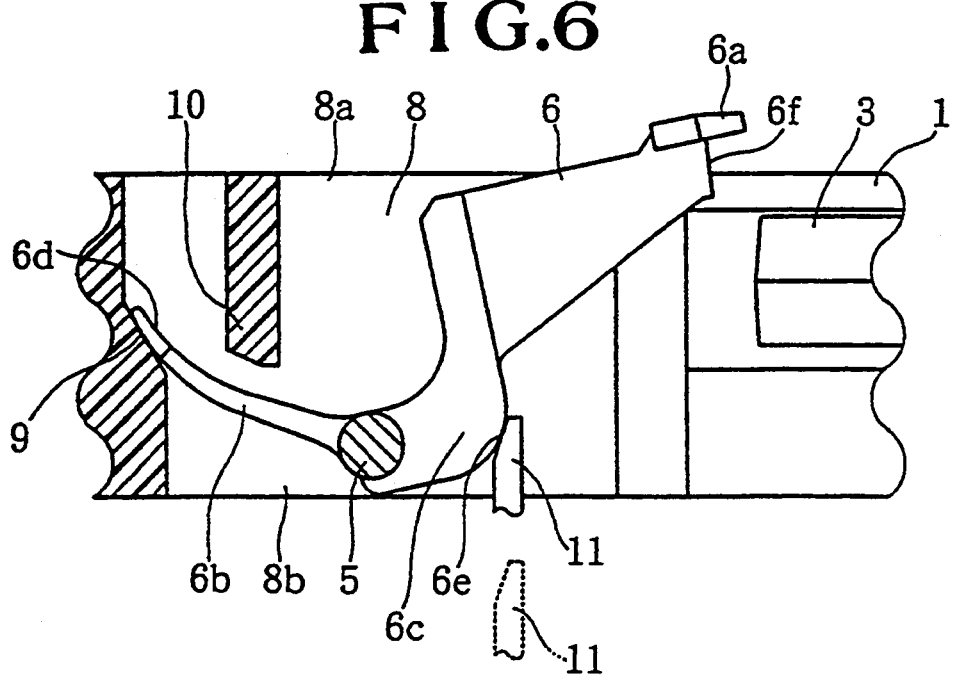
FIG. 6 is a sectional view of an important portion of the latch arm in a released state.

An elongated spring element 6b extends rearwardly from the pivotal support portion of each latch arm 6 pivotably supported by the shaft. The latch arm body and the spring element are integrally formed of synthetic resin material. The spring element 6b extends on the diagonal line in a direction opposite to the lock tab 6a (i.e., in the longitudinal direction of the latch arm 6). A free end 6d of the spring element 6b contacts a spring bearing portion 9, formed of an inclined surface on a rear inner wall of the through-chamber 8, when the latch arm 6 is pivoted upwardly. As shown in FIG. 6, when the latch arm 6 is pivoted upwardly, the free end portion 6d of the spring element 6b contacts the spring bearing portion 9 which prevents a further pivotal movement. As a result, the spring element 6b is bent to accumulate resilient force.

Figure 7:
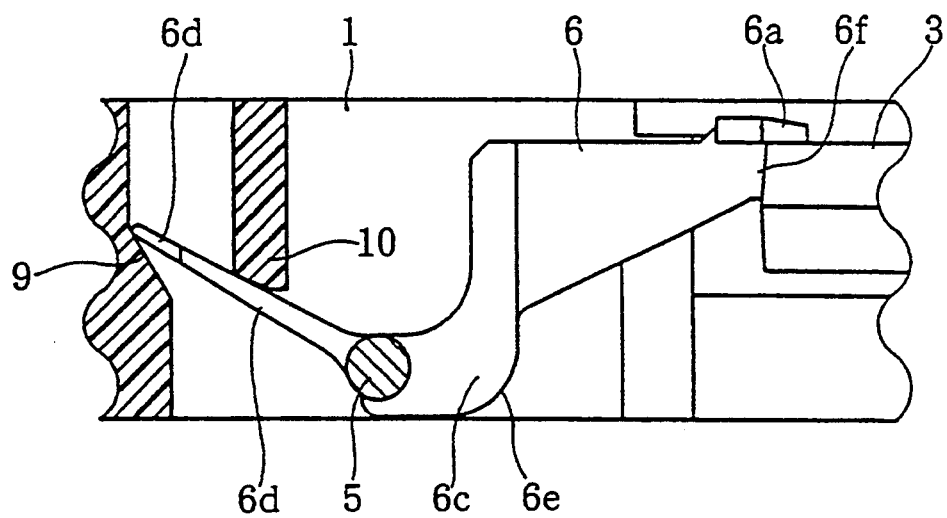
FIG. 7 is a sectional view of an important portion of the latch arm in an engaging state.

As a means for preventing an excessive downward pivotal movement of the latch arm 6, for example, a stop 10 for restricting (or restraining) an upward pivotal movement of the spring element 6b is integrally formed on an inner wall of the through-chamber 8. As one example, as shown in FIG. 7, the stop 10 is disposed such that when the latch arm 6 is in an engagement position, the stop 10 is in abutment with an upper surface of the spring element 6b and the free end 6d of the spring element 6b is abutted with the spring bearing portion 9.

Basal portions of the latch arms 6 are respectively connected to central portions of the shaft portions 5, while a basal portion of each spring element 6b is connected to both end portions of the respective shaft portion 5. The spring element 6b is gradually reduced in width as it extends away from the connecting portion towards the free end portion 6d and is also gradually reduced in thickness. The narrowest and thinnest free end portion 6d is operated to contact the spring bearing portion 9.

As shown in FIGS. 5 and 6, when the latch arm 6 is pivoted upwardly about the shaft portion 5, the spring element 6b is prevented from undergoing pivotal movement by the spring bearing portion 9 and is thus bent to accumulate resilient force, and the lock tab 6a is pivoted into a position where the lock tab 6a does not interfere with the IC (i.e. a disengaged position).

As mentioned above, the basal portion of each latch arm 6 is provided with the elbow portion 6c facing the lower opening portion 8b of the through-chamber 8. A curved outer surface of this elbow portion 6c is formed with an arc shape, this arcuately curved portion serves as a pressure receiving portion 6e for a jig 11, and the portion 6e serves as a shutter means for the latch arm 6. It is contemplated that the jig 11 will be operated by a robot. The jig 11, as shown in FIG. 6, is vertically movable. When the jig 11 is moved upwardly, one end of the jig 11 is inserted into the through-chamber 8 through the lower opening portion 8b in order to push up the pressure bearing portion 6e, and as a result, the latch arm 6 is caused to be pivoted upwardly so as to be disengaged from the IC 3. In that state (i.e., when the latch arm 6 is in a released state), the IC 3 can be inserted into and removed from the IC accommodation portion 2. When the force of the jig 11 pushing up against the latch arm 6 is removed, the latch arm 6 is automatically pivoted downwardly due to a restoring force (i.e. the accumulated resilient force) of the spring element 6b so as to be engaged with an upper surface of the corner portion of the IC 3. As a result, the IC 3 is held on the base member 1. As shown in FIG. 7, when the lock tab 6a of each latch arm 6 is in engagement with the corner portion of the IC 3, a small amount of resilient force still remains in the spring element 6b, and the lock tab 6a is lightly pressed against the corner portion by this resilient force, so that the engagement is maintained.

In the engaged state shown in FIG. 7, since the upward pivotal movement of the latch arm 6 is prevented by the spring bearing portion 9 even if the resilient force of the spring element 6b is zero, the engagement between the IC 3 and the lock tab 6a can be maintained.

Figure 4:
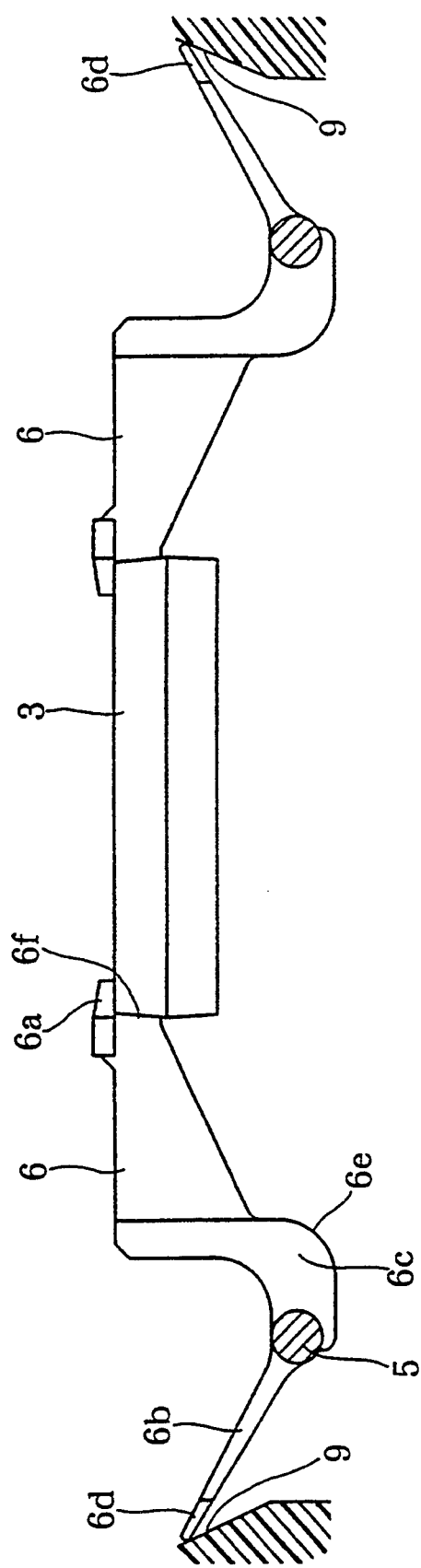
FIG. 4 is a side view of a latch arm engaged with an IC.

When the lock tab 6a of the latch arm 6 is in engagement with the IC, the upper end face 6f of the latch arm 6 is abutted with a side surface (for example, the side surface of the corner portion), and the IC is correctly positioned and held by and between the upper end faces 6f of the opposing latch arms 6. Therefore, the upper end face 6f of each latch arm 6 forms a positioning surface for the IC. The lock tab 6a is brought into engagement with the IC which is correctly positioned and held by and between the upper end faces 6f of the opposing latch arms 6. In FIG. 4, the latch arms 6 are shown in engagement with the opposing corner portions of the IC 3 so that the IC 3 is held on the base member 1. As understood from FIG. 4, the latch members 6 may be engaged with all four corners or they may be engaged with two opposing corners of the IC. The latch arms 6 may be engaged with those edge portions of the IC 3 which include the corner portions, respectively.

In the above embodiment, the latch arms 6, the spring elements 6b, and the shaft portions 5 are integrally formed of synthetic resin. As a modified embodiment, the spring elements 6b may be made of metal and integrally formed with the latch portions 6. The shaft portions 5 may be metal pins, respectively.

In the drawings, the present invention is shown as being applied to an IC carrier. However, the present invention may be applied to an IC socket. Although not shown, an IC socket is formed by implanting a plurality of contacts into the base member 1 such that the contacts can be brought into contact with leads 7 of the IC 3, respectively. The contacts are arranged around the IC accommodation portion, for example, the area corresponding to the seat members 4, so that they are readily brought into contact with the IC leads 7, respectively. In this case, the latch arm 6 is engaged with the edge portion of the IC 3 and serves as a means for maintaining the foregoing contacting relation.

In the above embodiment, the base member is formed in a regular square configuration, and the latch arms are disposed on the diagonal lines. When the base member takes, for example, a rectangular configuration, the latch arms are disposed on the diagonal lines, or at angles or parallel with each side of the base member, respectively.

According to the present invention, resilient force is accumulated due to the spring elements of the latch arms themselves. By this resilient force, the latch arms are automatically returned in the engaging direction so as to function to maintain the engagement with the IC.

Functions similar to those obtained with the one-piece type IC carrier can be obtained with a two-piece construction. As described above, according to the present invention, there can be obviated problems often experienced with the conventional one-piece type IC carrier or IC socket, including that the latch arms are subjected to resilient deterioration due to repeated use thereof and that molding is difficult. In addition, problems such as insufficient engagement of the latch arms, erroneous engagement, and the like due to wear of the engaging portions resulting from repeated use, as often experienced in the two-piece type IC carrier or IC socket in which the latch arms are pivotably supported on the base member. According to the present invention, even if the IC is repeatedly inserted into and removed from the base member of the IC carrier or IC socket, the latch arms can still maintain full functionality.

What is claimed is:

1. An apparatus for accommodating an IC, said apparatus comprising:
   a base member having, at an inner portion thereof, an IC accommodation portion for accommodating the IC;
   a plurality of latch arms, each of said latch arms being pivotably mounted on said base member for pivotal movement between an engaging position in which said latch arm engages with an edge of the IC when the IC is accommodated in said accommodation portion of said base member and a disengaging position;
   wherein said latch arms are mounted at positions about a periphery of said IC accommodation portion, respectively;
   wherein each of said latch arms includes a main body portion having a pivot portion at which said latch arm is pivotably mounted to said base member for pivotal movement about a pivot axis, a lock tab formed at an inner end of said latch arm at a position located inwardly of said pivot portion for abutting against the edge of the IC when the IC is accommodated in said accommodation portion of said base member and said latch arm is in said engaging position, and an elongated spring element projecting from said pivot portion on an outer side of said pivot portion opposite said inner side of said pivot portion such that said elongated spring element extends from said pivot portion in an outward direction away from said lock tab and perpendicular to said pivot axis;
   wherein, for each of said latch arms, said spring element is formed integrally with said main body portion; and
   wherein said base member includes bending means for resiliently bending said spring elements when said latch arms are pivoted into said disengaging positions so as to bias said latch arms back toward said engaging positions, respectively.

2. An apparatus as recited in claim 1, wherein
   said base member includes walls facing inwardly toward said accommodation portion; and
   said bending means comprises a plurality of bearing portions of said walls inclined relative to remaining portions of said walls.

3. An apparatus as recited in claim 1, wherein
   said latch arms are formed of synethic resin.

4. An apparatus as recited in claim 3, wherein said base member includes walls facing inwardly toward said accommodation portion; and said bending means comprises a plurality of bearing portions of said walls inclined relative to remaining portions of said walls.

5. An apparatus for accommodating an IC, said apparatus comprising:
- a base member having, at an inner portion thereof, an IC accommodation portion for accommodating the IC;
- a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
- wherein said latch arms are mounted at positions about a periphery of said IC accommodation portion, respectively;
- wherein each of said latch arms includes a main body portion having a pivot portion at which said latch arm is pivotably mounted to said base member for pivotal movement about a pivot axis, a lock tab formed at an inner end of said latch arm at a position located inwardly of said pivot portion for abutting against the edge of the IC when the IC is accommodated in said accommodation portion of said base member and said latch arm is in said engaging position, and an elongated spring element projecting from said pivot portion on an outer side of said pivot portion opposite said inner side of said pivot portion such that said elongated spring element extends from said pivot portion in an outward direction away from said lock tab and perpendicular to said pivot axis;
- wherein, for each of said latch arms, said spring element is formed integrally with said main body portion: and
  - wherein said base member includes stop means for restraining each of said latch arms from pivoting beyond said engaging position when moving from said disengaging position toward said engaging position.

6. An apparatus as recited in claim 5, wherein said latch arms are formed of synethic resin.

7. An apparatus for accommodating an IC, said apparatus comprising:
- a base member having, at an inner portion thereof, an IC accommodation portion for accommodating the IC;
- a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
- wherein said latch arms are mounted at positions about a periphery of said IC accommodation portion, respectively;
- wherein each of said latch arms includes a main body portion having a pivot portion at which said latch arm is pivotably mounted to said base member for pivotal movement about a pivot axis, a lock tab formed at an inner end of said latch arm at a position located inwardly of said pivot portion for abutting against the edge of the IC when the IC is accommodated in said accommodation portion of said base member and said latch arm is in said engaging position, and an elongated spring element projecting from said pivot portion on an outer side of said pivot portion opposite said inner side of said pivot portion such that said elongated spring element extends from said pivot portion in an outward direction away from said lock tab and perpendicular to said pivot axis;
- wherein, for each of said latch arms, said spring element is formed integrally with said main body portion; and
- wherein said pivot portion comprises a pivot shaft.

8. An apparatus for accommodating an IC, said apparatus comprising:
- a base member having, at an inner portion thereof, an IC accommodation portion for accommodating the IC;
- a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
- wherein said latch arms are mounted at positions about a periphery of said IC accommodation portion, respectively;
- wherein each of said latch arms includes a main body portion having a pivot portion at which said latch arm is pivotably mounted to said base member for pivotal movement about a pivot axis, a lock tab formed at an inner end of said latch arm at a position located inwardly of said pivot portion for abutting against the edge of the IC when the IC is accommodated in said accommodation portion of said base member and said latch arm is in said engaging position, and an elongated spring element projecting from said pivot portion on an outer side of said pivot portion opposite said inner side of said pivot portion such that said elongated spring element extends from said pivot portion in an outward direction away from said lock tab and perpendicular to said pivot axis;
- wherein, for each of said latch arms, said spring element is formed integrally with said main body portion:
- wherein said base member includes walls facing inwardly toward said accommodation portion; and
- wherein said walls include spring bearing portions inclined relative to remaining portions of said walls and located at positions respectively corresponding to positions of outermost ends of said elongated spring elements.

9. An apparatus for accommodating an IC, said apparatus comprising:
- a base member having an IC accommodation portion for accommodating the IC;
- a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
- wherein each of said latch arms includes a main body portion having a pivot portion at which said latch arm is pivotably mounted to said base member, a lock tab formed at one end of said latch arm on one side of said pivot portion for abutting against the edge of the IC when the IC is accommodated in said accommodation portion of said base member and said latch arm is in said engaging position, and a spring element projecting from said pivot portion on a second side of said pivot portion opposite said first side of said pivot portion such that said spring element extends from said pivot portion in a direction away from said lock tab;

wherein, for each of said latch arms, said spring element is formed integrally with said main body and constitutes a means for resiliently returning said latch arm to said engaging position from said disengaging position; and wherein said base member includes bending means for resiliently bending said spring elements when said latch arms are pivoted into said disengaging positions so as to bias said latch arms back toward said engaging positions, respectively.

10. An apparatus as recited in claim 9, wherein
said base member includes walls facing inwardly toward said accommodation portion; and
said bending means comprises a plurality of bearing portions of said walls inclined relative to remaining portions of said walls.

11. An apparatus as recited in claim 9, wherein
said latch arms are formed of synethic resin.

12. An apparatus as recited in claim 11, wherein
said base member includes walls facing inwardly toward said accommodation portion; and
said bending means comprises a plurality of bearing portions of said walls inclined relative to remaining portions of said walls.

13. An apparatus for accommodating an IC, said apparatus comprising:
a base member having an IC accommodation portion for accommodating the IC;
a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
wherein each of said latch arms includes a main body portion having a pivot portion at which said latch arm is pivotably mounted to said base member, a lock tab formed at one end of said latch arm on one side of said pivot portion for abutting against the edge of the IC when the IC is accommodated in said accommodation portion of said base member and said latch arm is in said engaging position, and a spring element projecting from said pivot portion on a second side of said pivot portion opposite said first side of said pivot portion such that said spring element extends from said pivot portion in a direction away from said lock tab;

wherein, for each of said latch arms, said spring element is formed integrally with said main body and constitutes a means for resiliently returning said latch arm to said engaging position from said disengaging position; and wherein said base member includes stop means for restraining each of said latch arms from pivoting beyond said engaging position when moving from said disengaging position toward said engaging position.

14. An apparatus as recited in claim 13, wherein
said latch arms are formed of synethic resin.

15. An apparatus for accommodating an IC, said apparatus comprising:
a base member having an IC accommodation portion for accommodating the IC;
a plurality of latch arms, each of said latch arms being pivotably mounted on said base member for pivotal movement between an engaging position in which said latch arm engages with an edge of the IC when the IC is accommodated in said accommodation portion of said base member, and a disengaging position;
wherein each of said latch arms includes a main body portion having a pivot portion at which said latch arm is pivotably mounted to said base member, a lock tab formed at one end of said latch arm on one side of said pivot portion for abutting against the edge of the IC when the IC is accommodated in said accommodation portion of said base member and said latch arm is in said engaging position, and a spring element projecting from said pivot portion on a second side of said pivot portion opposite said first side of said pivot portion such that said spring element extends from said pivot portion in a direction away from said lock tab;

wherein, for each of said latch arms, said spring element is formed integrally with said main body and constitutes a means for resiliently returning said latch arm to said engaging position from said disengaging position; and wherein said pivot portion comprises a pivot shaft.

* * * * *